United States Patent [19]

Trevison et al.

[11] Patent Number: 4,837,928
[45] Date of Patent: Jun. 13, 1989

[54] METHOD OF PRODUCING A JUMPER CHIP FOR SEMICONDUCTOR DEVICES

[75] Inventors: Robert L. Trevison, Spokane, Wash.; William E. McKee, Coeur D'Alene, Id.; Larry B. Hunnel, Otis Orchards, Wash.

[73] Assignee: Cominco Ltd., Canada

[21] Appl. No.: 148,618

[22] Filed: Jan. 26, 1988

Related U.S. Application Data

[62] Division of Ser. No. 920,081, Oct. 18, 1986, Pat. No. 4,745,036.

[51] Int. Cl.⁴ .............................................. H05K 3/34
[52] U.S. Cl. ...................................... 29/840; 29/827; 228/193; 228/194; 228/263.12
[58] Field of Search .................... 29/840, 827; 357/71, 357/67; 174/68.5; 228/193, 194, 263.12

[56] References Cited

U.S. PATENT DOCUMENTS

| | | | |
|---|---|---|---|
| 3,031,747 | 5/1962 | Green | 228/263.12 X |
| 3,042,550 | 7/1962 | Allen et al. | 228/263.12 X |
| 3,241,011 | 3/1966 | De Mille et al. | |
| 3,252,722 | 5/1966 | Allen | 228/263.12 X |
| 3,292,240 | 12/1966 | McNutt et al. | |
| 3,292,241 | 12/1966 | Carroll | |
| 3,298,093 | 1/1967 | Cohen | |
| 3,418,422 | 12/1968 | Bradham, III | |
| 3,544,704 | 12/1970 | Glenn, Jr. et al. | 174/68.5 |
| 3,559,285 | 2/1971 | Kauffman | 29/827 |
| 3,591,839 | 7/1971 | Evans | |
| 3,600,794 | 8/1971 | Shibata et al. | |
| 3,616,406 | 10/1971 | Turner | |
| 3,617,819 | 11/1971 | Boisvert et al. | |
| 3,657,611 | 4/1972 | Yoneda | 357/67 X |
| 3,761,310 | 9/1973 | Preobrazhentsev et al. | |
| 3,770,874 | 11/1973 | Krieger et al. | |
| 3,849,865 | 11/1974 | Gedwill et al. | |
| 3,850,688 | 11/1974 | Halt | 357/71 X |
| 3,923,231 | 12/1975 | Catalano et al. | |
| 3,935,986 | 2/1976 | Lattari et al. | |
| 4,142,202 | 2/1979 | Csillag et al. | 357/71 |
| 4,268,585 | 5/1981 | Daur et al. | |
| 4,355,084 | 10/1982 | Kitchen | |
| 4,447,857 | 5/1984 | Marks et al. | |
| 4,558,346 | 12/1985 | Kida et al. | |
| 4,563,811 | 1/1986 | Cranston | 29/827 |
| 4,574,470 | 3/1986 | Burt | |

Primary Examiner—Howard N. Goldberg
Assistant Examiner—Carl J. Arbes
Attorney, Agent, or Firm—Stevens, Davis, Miller & Mosher

[57] ABSTRACT

In the manufacture of semiconductor device packages, a jumper chip, comprising a substrate and a gold alloy attached thereto, with improved bonding characteristics is provided. By applying a coating of gold on both sides of the gold alloy prior to attaching the gold alloy to the substrate, the bonding of the gold alloy to the substrate and to the gold coating of the cavity in a device package is improved. Scrubbing of the jumper chip on the gold coating of the cavity is obviated. The additional gold layers applied to the gold alloy are distinct and visible on a photograph of a cross-section of the jumper chip.

10 Claims, 1 Drawing Sheet

METHOD OF PRODUCING A JUMPER CHIP FOR SEMICONDUCTOR DEVICES

This is a division of application Ser. No. 920,081 filed Oct. 18, 1986, Now U.S. Pat. No. 4,745,036 issued May 17, 1988.

This invention relates to electronic device packages and, more particularly, to transition terminals or jumper chips.

BACKGROUND OF THE INVENTION

In many semiconductor devices, an integrated-circuit chip is mounted on the bottom of a gold-plated cavity of a hermetically sealed package with connecting wire leads extending from the package. Fine aluminum wires are bonded to the wire lead frame and the integrated-circuit chip. Usually, the circuit chip is grounded by means of a metal terminal chip or jumper chip, which is bonded to the gold-coated cavity adjacent the circuit chip by scrubbing and heating. The use of a jumper chip is necessary to avoid the formation of an intermetallic compound between aluminum and gold, known as purple or white plague, which forms when a sealing step is carried out at elevated temperature and weakens the bond. A weakened bond decreases the electrical conductivity which may result in bond failure and decreases the reliability of the semiconductor device. The scrubbing of the gold layer of the cavity with the jumper chip is necessary to provide an adequate bond between the jumper chip and the cavity of the device package.

During a study of the ability of gold silicon alloys to wet substrates, we had observed that when a thin preform of Au-Si alloys was melted, a skin of transparent material formed around the preform. This skin was able to hold the melted alloy within it and was one of the reasons that it is necessary to scrub chips to make Au-Si alloy preforms wet and adhere to a substrate.

DESCRIPTION OF PRIOR ART

Terminals or jumper chips are usually made of a preform, consisting of a substrate, having an aluminum layer on its upper surface and a Au-Ge, Au-Si, or Au-Ge-Si alloy layer on its lower surface. The substrate may be made of ceramic, alumina, molybdenum, Fe-Ni alloys, or Fe-Co-Ni alloys.

According to Japanese Publication No. 55-27615, a jumper chip consists of an Fe-Ni or Fe-Co-Ni alloy base layer with an aluminum or Al-Si alloy layer on one surface and a Au-Ge alloy layer on the other. The chips are punched from a laminated plate formed by pressure rolling the upper and lower layers to the base layer. According to U.S. Pat. No. 4,558,346, chips are made from a laminate similar to that according to the Japanese publication but the Au-Ge layer is replaced with a Au-Si or Au-Ge-Si alloy layer.

Japanese Publication No. 59116368 discloses a method for manufacturing a clad material by plating gold on a KOVAR wire substrate material, adhering a Au-Si alloy tape to the plated substrate and an Al-Si tape to the other side of the substrate and rolling the laminate in several stages. Small discs are press-punched from the resulting clad material. U.S. Pat. No. 3,298,093 teaches gold cladding or plating a KOVAR substrate, depositing silicon to form a Au-Si alloy and bonding the so coated substrate to gold-plated silicon by heating under pressure in a reducing atmosphere to ensure good contact. Bonding of gold or gold-silicon to substrates is also disclosed in U.S. Pat. Nos. 3,065,534, 3,093,882, 3,209,450, 3,316,628, 3,585,711, 3,593,412, 3,684,930, 3,703,306, 3,729,807 and 4,214,904.

In spite of strength, or alleged strength, of the bonded jumper chips according to the prior art, a weakening or failure of the bond between the jumper chip and the gold-plated cavity of the package can still occur. Weakening can also occur when the scrubbing of the chip on the gold-plated cavity is inadequate or is carried out with insufficient care. Failure can also occur due to inadequate bonding between the gold alloy layer and the substrate layer.

SUMMARY OF THE INVENTION

We have now found that interlayer bond failure and the scrubbing of a jumper chip on a gold-layer of the cavity can be essentially obviated whereby weakened bonds in the chip and between jumper chip and package cavity are substantially eliminated. More specifically, we have found that by applying a gold coating on both sides of the gold alloy, i.e., the Au-Ge, Au-Si, or Au-Ge-Si layer of the laminate from which jumper chips are formed, a very strong bond is formed between the gold alloy layer and the substrate, and also when the gold coating of the chip is bonded to the gold layer of the package cavity.

It is an object of the present invention to provide a method for making jumper chips with improved bonding characteristics. It is another object to provide a jumper chip with improved bonding characteristics. It is a further object to provide a method of producing a laminate with improved atmospheric oxidation characteristics. These and other objects of the present invention can be achieved by providing, in one embodiment, a method for producing a laminate consisting of a substrate, an upper layer on one side of said substrate, a gold-alloy layer, an intermediate gold layer at one side of said gold-alloy layer intermediate the other side of said substrate and said gold-alloy layer, and a lower gold layer on the other side of said gold-alloy layer, said method comprising the steps of (a) coating one side of said substrate with a coating of gold;
(b) coating both sides of said gold-alloy layer with a layer of gold;
(c) placing said coating of gold on said substrate in contact with the layer of gold on one side of said gold-alloy layer to form an assembly; and
(d) hot rolling said assembly to create a bond between said coating of gold on said substrate and said layer of gold on one side of said gold-alloy layer;
whereby a laminate is obtained wherein said intermediate gold layer has a distinct thickness.

According to a second embodiment, there is provided a method for producing jumper chips from a laminate which comprises the steps of (a) coating one side of a sheet of substrate made of a material chosen from the group consisting of Alloy 42 and KOVAR with a micron-thick coating of gold;
(b) coating both sides of a gold-alloy layer with layers of gold, said gold-alloy being chosen from the group consisting of gold-germanium alloys, gold-silicon alloys and gold-germanium-silicon alloys, the silicon-containing alloys containing silicon in an amount in the range of about 0.3 to 4.0% by weight and the germanium-containing alloys containing germanium in an amount of less than about 12% by weight;

(c) placing said coating of gold on said substrate in contact with the layer of gold on one side of said gold-alloy layer to form an assembly;

(d) hot-rolling said assembly to create a bond between said coating of gold on said substrate and said layer of gold on one side of said gold-alloy layer;

(e) coating the other side of said substrate of the bonded assembly with an upper layer of a material chosen from the group consisting of aluminum-silicon alloys and aluminum; and (f) pressing jumper chips from the coated bonded assembly whereby said jumper chips have a distinct layer of gold intermediate said substrate and said gold-alloy layer.

According to a third embodiment, there is provided a jumper chip for use in semiconductor devices consisting of a substrate; an upper layer on one side of said substrate; a gold-alloy layer; an intermediate gold layer on one side of said gold-alloy layer, said intermediate gold layer having a distinct thickness and being intermediate the other side of said substrate and the one side of said gold-alloy layer; and a lower gold layer on the other side of said gold-alloy layer; said upper layer, said substrate, said gold-alloy layer, said intermediate gold layer and said lower gold layer being integral and contiguous.

DETAILED DESCRIPTION

In the process for producing a semiconductor device package, an integrated-circuit chip is mounted on the bottom of a cavity in the package. The bottom is usually covered with a layer of gold. The circuit chip is placed on the gold-coated cavity and scrubbed onto the gold-coated surface while the cavity bottom is heated. A bond is formed whereby the silicon of the circuit chip alloys with the gold-coated surface.

Prior to attachment of the circuit chip and prior to wire bonding, a jumper chip is attached to the gold-coated surface in order to enable the grounding of the circuit chip at the lower surface of the circuit chip. After the circuit chip and the jumper chip have been bonded in the cavity, aluminum wires are wire-bonded to the circuit chip and the wire lead frame, and a wire is connected between the jumper chip and one of the lead wire terminals.

Figure 1:
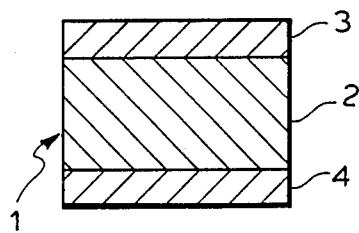
FIG. 1 is an enlarged sectional view of a terminal according to the prior art.

With reference to Figure 1, the jumper chip according to the prior art is generally indicated at 1 and comprises a metal substrate 2, that is made of an Fe-Ni alloy, such as e.g. Alloy 42, or an Fe-Co-Ni alloy, such as e.g. KOVAR, an upper surface layer 3 made of a thin layer of aluminum or an Al-Si alloy, and a lower gold-alloy layer 4 made of a Au-Ge (<12% Ge), Au-Si (1–8% Si), or Au-Ge-Si (0.3–3% Si, <12% Ge) alloy. The jumper chips 1 may be punched from a laminate made by cladding or rolling a thin sheet of Al or Al-Si alloy on one side and a thin sheet of Au-Ge, Au-Si or Au-Ge-Si alloy on the other side of a substrate that may or may not be gold coated. Alternatively, the Al or Al-Si alloy on the one side of the substrate may be applied by vapor deposition or sputtering.

The jumper chips of the prior art are attached to the gold-coated surface of the cavity in the device package. The jumper chip 1 is placed on the gold layer to bring the lower gold-alloy layer 4 in contact with the gold layer while being heated. Then the gold layer is scrubbed with jumper chip 1. The gold layer and the alloy of the lower gold-alloy layer 4 melt and alloy. After cooling, jumper chip 1 is bonded to the gold layer of the package cavity.

DESCRIPTION OF THE PREFERRED EMBODIMENTS

We have found that, unless the scrubbing of the jumper chip on the gold layer is carried out adequately and with great care, failure of the bond between jumper chip and package cavity can occur. Without being bound by theoretical considerations, this is thought to be due to the formation of an oxide film on the surfaces of the lower gold-alloy layer 4 prior to its attachment to the gold layer of the package cavity. The formation of an oxide layer can also occur on the lower gold-alloy layer 4 during manufacture of the laminate from which the jumper chips are made and, thus, adversely influence the bond between the lower gold-alloy layer 4 and the substrate 2 of the jumper chip.

Figure 2:
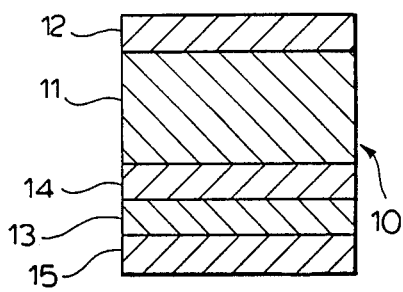
FIG. 2 is an enlarged sectional view of a jumper chip according to the present invention.

With reference FIG. 2, the jumper chip according to the invention, generally indicated at 10, comprises a substrate 11, an upper layer 12 on one side of substrate 11, a gold-alloy layer 13, a gold layer 14 on one side of the gold-alloy layer 13 intermediate the other side of the substrate 11 and the gold-alloy layer 13, and a lower gold layer 15 on the other side of gold-alloy layer 13. The layers 11, 12, 13, 14 and 15 of the jumper chips are integral and contiguous.

The substrate may be made from an alloy chosen from the group consisting of Fe-Ni alloys such as, for example Alloy 42, and Fe-Co-Ni alloys such as, for example, KOVAR. The substrate may be coated with a thin layer of gold (not shown) on its surface which is to be bonded to the intermediate gold layer 14. The thin layer of gold on the substrate may be applied by suitable means such as by plating. The thickness of the gold coating on the substrate is usually a few micro inches, such as, for example, 20 micro inches.

Figure 3:
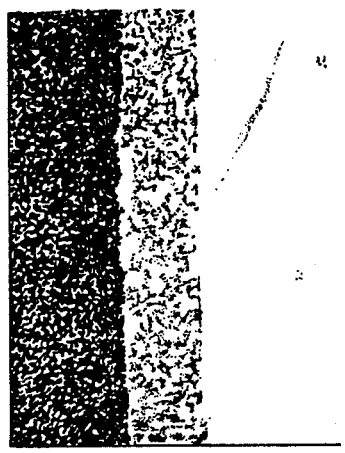
FIG. 3 is a drawing of a cross-section of a jumper chip according to the prior art.
Figure 4:
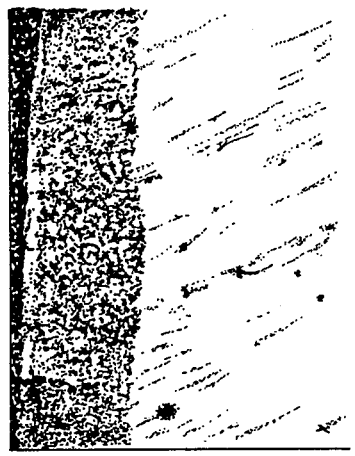
FIG. 4 is drawing of a cross-section of a jumper chip according to the present invention.

The upper layer 12 is made of a material chosen from the group consisting of aluminum and Al-Si alloys, such as an alloy containing, for example, about 3.3% silicon by weight. The gold-alloy layer 13 is made of an alloy of gold with silicon, of gold with germanium, or of gold with germanium and silicon. The silicon content of the gold-alloy layer 13 is preferably in the range of about 0.3 to 4%, and the germanium content should be less than about 12%. Both the intermediate gold layer 14 and the lower gold layer 15 are made of high-purity gold and have thicknesses that are distinct and visible when a cross-section of jumper chip 11 is studied and enlarged under a microscope as can be seen in the FIG. 4. The distinct thickness of intermediate gold layer 14 is in the range of about 20 to 60 micro inches, preferably about 45 micro inches. No such distinct gold layers are visible in the drawing of FIG. 3 of the jumper chip according to the prior art. It is believed that the additional gold layers 14 and 15 neutralize or mask any deleterious effect of an oxide layer on either side of gold-alloy layer 13 and allow ready bonding of the gold layers 14 and 15 on the gold-alloy layer 13 to the gold coating of the substrate 11 and the gold layer on the package cavity.

In the manufacture of the laminate from which jumper chips are pressed or punched, a sheet, layer, or strip of substrate 11 is plated on one side with a micro inch thick coating of gold. A sheet, layer, or strip of gold-alloy 13 is coated on both sides with a thin layer of gold. The gold is preferably applied by plating or sputtering to a thickness of about 20 micro inches. The gold-plated gold-alloy may then be hot-rolled to thin the applied layers. In a preferred embodiment, a second layer of gold is applied, preferably again by plating or sputtering to about the same thickness as the first layer and the gold-plated gold-alloy layer 13 may again be hot-rolled such that the resulting gold-alloy layer 13 has a gold layer 14 on one side and a gold layer 15 on its opposite side, each with a final thickness in the range of about 20 to 60 micro inches, preferably about 45 micro inches. The gold-alloy layer 13 with gold layers 14 and 15, which is now substantially inert to atmospheric attack, is placed in contact with the gold-coated side of substrate 11 to form an assembly and the assembly is preferably hot-rolled to bond the gold-coated gold-alloy layer 13 to the substrate 11. Rolling is continued until the desired thickness of the gold-alloy layer 13 is obtained. During hot-rolling, the gold coating on substrate 11 and the gold-alloy layer 13 diffuse into each other at least to some degree, but the thickness of the resulting gold layer 14 is such that the intermediate layer 14 is distinctly visible under a microscope. After rolling is completed, a thin upper layer 12 of aluminum, or an Al-Si alloy, is coated by, e.g., vapor-deposition or sputtering on the top of the substrate 11. The upper layer has a thickness in the range of about 150 to 400 micro inches. Alternatively, the upper layer 12 may be applied as a thin sheet or strip and rolled onto the substrate, separately from or simultaneously with the rolling of the substrate with the gold-alloy layer 13.

The invention will now be illustrated by means of the following non-limitative examples.

EXAMPLE 1

A first laminate of layers of pure gold on Au-2% Si alloy was formed. A thin sheet of gold was joined to both sides of a sheet of Au-2% Si alloy at 118,000 psi for 30 minutes at room temperature. The adhesion of the gold layers was adequate to permit hot-rolling of the laminate to a thickness of 0.002 inch. The final thickness of the gold layers was 7.8 and 13 micro inches, respectively. Upon inspection of the surface of the gold coatings on the alloy, it was observed under the microscope that the thickness of the gold layers was not enough to cover the alloy surfaces completely, but was adequate to provide excellent adhesion of the gold layers to the alloy. The gold layers could not be separated.

A second laminate was made in a similar manner but with slightly thicker layers of gold applied to the Au - Si alloy. After hot-rolling, the thickness of both the gold layers was measured to be 31 micro inches. Inspection under the microscope revealed a complete coverage of the Au-Si alloy with gold.

EXAMPLE 2

The second laminate from Example 1 was used to test its adhesion to a gold-plated substrate without scrubbing.

A number of jumper chips punched from the laminate having gold coatings of 31 micro inches on each side was placed on a gold-plated KOVARE substrate. On top of each jumper chip was placed a nickel-plated copper disc to provide a slight pressure for making adequate contact between the chips and the substrate. The assembly was placed in a furnace and heated to a temperature of 700° F. After cooling, it was found impossible to separate the chips from the substrate.

EXAMPLE 3

Several jumper chips punched from the same laminate as used in the previous examples were placed between two 0.500 inch square, gold-plated KOVAR lids and the assembly was heated quickly to 700° F. by placing it on a heating block at that temperature. After cooling it was found to be impossible to separate the two lids without tearing the lids.

EXAMPLE 4

The tests of Examples 2 and 3 were repeated with Au-2% Si chips without gold coatings on either side and gold-plated KOVAR substrates. The chips were not scrubbed onto the substrates. No bond could be achieved by either heating, rolling, or heating under pressure of the assemblies.

EXAMPLE 5

This example illustrates the manufacture of jumper chips according to a preferred embodiment of the invention.

A 1,400 inch wide and 0.020 inch thick substrate strip of KOVAR was plated with 20 micro inches of gold. A sheet of 49 pure gold and 69 pure silicon having dimensions of 3×7×0.300 inches was prepared from the elements and the resulting Au - 3.3% Si alloy was annealed for 2 hours at 600° F., cleaned and plated with 20 micro inches of gold. The gold-plated Au-Si alloy sheet was wrapped in 0.013 inch thick gold foil, hot-rolled at 550° F. to 0.200 inch, cleaned and annealed for 15 minutes at 600° F. A second gold coating was applied by wrapping the gold-coated alloy in 59 pure gold foil having a thickness of 0.0083±0.0003 inch, cold-rolled in several stages to 0.008 inch and hot-rolling the alloy with the two gold coatings at 250° F. in several stages to a thickness of 0.0030±0.0002 inch.

The gold-plated KOVAR substrate and the gold-coated Au-Si alloy were placed in contact to form an assembly. The assembly was hot-rolled at 550° F. in two passes to a final thickness of 0.00104±0.00004 inch.

A layer of aluminum was applied to the other side of the substrate by vapor deposition to a thickness of 200 micro inches.

Jumper chips were subsequently punched out of the aluminum-coated, hot-rolled assembly.

We claim:

1. A method for producing a laminate consisting of a substrate, an upper layer on one side of said substrate, a gold-alloy layer, an intermediate gold layer at one side of said gold-alloy layer intermediate the other side of said substrate and said gold-alloy layer, and a lower gold layer on the other side of said gold-alloy layer, said method comprising the steps of
    (a) coating one side of said substrate with a coating of gold;
    (b) coating both sides of said gold-alloy layer with a layer of gold;
    (c) placing said coating of gold on said substrate in contact with the layer of gold on one side of said gold-alloy layer to form an assembly; and (d) hot rolling said assembly to create a bond between said coating of gold on said substrate and said layer of gold on one side of said gold-alloy layer;
whereby a laminate is obtained wherein said intermediate gold layer has a distinct thickness.

2. A method as claimed in claim 1, wherein said substrate is made of a material chosen from the group consisting of iron-nickel alloys and iron-cobalt-nickel alloys.

3. A method as claimed in claim 1, wherein said substrate is made of a material chosen from the group consisting of Alloy 42 and KOVAR.

4. A method as claimed in claim 1, wherein said gold-alloy layer is made of a gold-alloy chosen from the group consisting of gold-germanium alloys, gold-silicon alloys and gold-germanium-silicon alloys and the silicon-containing alloys contain silicon in an amount in the range of about 0.3 to 4% by weight and the germanium-containing alloys contain germanium in an amount of less than about 12% by weight.

5. A method as claimed in claim 1, wherein the other side of said substrate is coated with an upper layer of a material chosen from the group consisting of aluminum-silicon alloys and aluminum.

6. A method as claimed in claim 1, wherein the coated gold-alloy layer is hot-rolled to reduce the thickness of the gold coated on both sides of the gold-alloy layer.

7. A method as claimed in claim 6, wherein prior to said placing in contact of step (c) of claim 1 said coated gold-alloy layer is coated on both sides with a second layer of gold and the twice-coated gold-alloy layer is hot-rolled to reduce the thickness of the gold on both sides of said gold-alloy layer.

8. A method for producing jumper chips from a laminate which comprises the steps of
(a) coating one side of a sheet of substrate made of a material chosen from the group consisting of Alloy 42 and KOVAR with a micro inch thick coating of gold;
(b) coating both sides of a gold-alloy layer with layers of gold, said gold-alloy being chosen from the group consisting of gold-germanium alloys, gold-silicon alloys and gold-germanium-silicon alloys, the silicon-containing alloys containing silicon in an amount in the range of about 0.3 to 4.0% by weight and the germanium-containing alloys containing germanium in an amount of less than about 12% by weight;
(c) placing said coating of gold on said substrate in contact with the layer of gold on one side of said gold-alloy layer to form an assembly;
(d) hot-rolling said assembly to create a bond between said coating of gold on said substrate and said layer of gold on one side of said gold-alloy layer;
(e) coating the other side of said substrate of the bonded assembly with an upper layer of a material chosen from the group consisting of aluminum-silicon alloys and aluminum; and
(f) pressing jumper chips from the coated bonded assembly whereby said jumper chips have a distinct layer of gold intermediate said substrate and said gold-alloy layer.

9. A method as claimed in claim 8, wherein the coated gold-alloy layer is hot-rolled to reduce the thickness of the gold coated on both sides of the gold-alloy layer.

10. A method as claimed in claim 9, wherein prior to said placing in contact of step (c) of claim 8 said coated gold-alloy layer is coated on both sides with a second layer of gold and the twice-coated gold-alloy layer is hot-rolled to reduce the thickness of the gold on both sides of said gold-alloy layer.

* * * * *